(12) United States Patent
Sato

(10) Patent No.: US 10,777,610 B2
(45) Date of Patent: Sep. 15, 2020

(54) PHOTO ELECTRIC CONVERTER, IMAGING SYSTEM, AND METHOD FOR MANUFACTURING PHOTOELECTRIC CONVERTER

(71) Applicant: CANON KABUSHIKI KAISHA, Tokyo (JP)

(72) Inventor: Nobuhiko Sato, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/676,238

(22) Filed: Nov. 6, 2019

(65) Prior Publication Data

US 2020/0075679 A1 Mar. 5, 2020

Related U.S. Application Data

(63) Continuation of application No. 15/899,860, filed on Feb. 20, 2018, now Pat. No. 10,516,000, which is a
(Continued)

(30) Foreign Application Priority Data

Aug. 8, 2014 (JP) .................................. 2014-163208

(51) Int. Cl.
*H01L 27/30* (2006.01)
*H04N 5/335* (2011.01)
(Continued)

(52) U.S. Cl.
CPC ...... *H01L 27/307* (2013.01); *H01L 27/14601* (2013.01); *H01L 27/14632* (2013.01); *H01L 27/14636* (2013.01); *H01L 27/14665* (2013.01); *H01L 27/14687* (2013.01); *H01L 51/442* (2013.01); *H01L 51/447* (2013.01); *H01L 51/448* (2013.01); *H04N 5/335* (2013.01); *H01L 27/14621* (2013.01); *H01L 2251/301* (2013.01)

(58) Field of Classification Search
None
See application file for complete search history.

(56) References Cited

U.S. PATENT DOCUMENTS

2006/0068586 A1* 3/2006 Pain ................. H01L 27/14601 438/643
2008/0032438 A1* 2/2008 Wen ................. H01L 27/14623 438/60

(Continued)

*Primary Examiner* — Evren Seven
(74) *Attorney, Agent, or Firm* — Canon U.S.A., Inc. IP Division

(57) ABSTRACT

A method for manufacturing a photoelectric converter includes a first step of preparing a semiconductor substrate including a metal oxide semiconductor (MOS) transistor, a second step of forming a plurality of interlayer insulating films above the semiconductor substrate, and a third step of forming a photoelectric conversion portion above the semiconductor substrate. The second step includes a step of forming a first film containing hydrogen. The third step includes a step of forming a first electrode, a step of forming a photoelectric conversion film, and a step of forming a second electrode. The method includes a step of performing heat treatment between the step of forming the first film and the step of forming the photoelectric conversion film.

27 Claims, 4 Drawing Sheets

Related U.S. Application Data continuation of application No. 15/191,342, filed on Jun. 23, 2016, now Pat. No. 9,917,140, which is a continuation of application No. 14/808,367, filed on Jul. 24, 2015, now Pat. No. 9,401,388.

(51) Int. Cl.
*H01L 27/146* (2006.01)
*H01L 51/44* (2006.01)

(56) References Cited

U.S. PATENT DOCUMENTS

| | | | |
|---|---|---|---|
| 2009/0065828 A1* | 3/2009 | Hwang | H01L 27/14687 257/292 |
| 2013/0009044 A1* | 1/2013 | Inomata | H01L 22/32 250/208.1 |
| 2014/0131828 A1* | 5/2014 | Isono | H01L 27/1464 257/459 |
| 2015/0270307 A1* | 9/2015 | Umebayashi | H01L 27/1464 257/292 |

\* cited by examiner

PHOTO ELECTRIC CONVERTER, IMAGING SYSTEM, AND METHOD FOR MANUFACTURING PHOTOELECTRIC CONVERTER

CROSS-REFERENCE TO RELATED APPLICATIONS

This application is a Continuation, and claims the benefit, of U.S. patent application Ser. No. 15/899,860 filed Feb. 20, 2018, which is a Continuation, and claim the benefit, of U.S. patent Ser. No. 15/191,342 filed Jun. 23, 2016 (now U.S. Pat. No. 9,917,140), which is a Continuation, and claims the benefit, of U.S. patent application Ser. No. 14/808,367 filed Jul. 24, 2015 (now U.S. Pat. No. 9,401,388), which claims priority from Japanese Patent Application No. 2014-163208, filed Aug. 8, 2014. Each of U.S. patent application Ser. No. 15/899,860, U.S. patent application Ser. No. 15/191,342, U.S. patent application Ser. No. 14/808,367, and Japanese Patent Application No. 2014-163208 is hereby incorporated by reference herein in its entirety.

BACKGROUND OF THE INVENTION

Field of the Invention

The present invention relates to a photoelectric converter, an imaging system, and a method for manufacturing a photoelectric converter.

Description of the Related Art

There are known photoelectric converters including photoelectric conversion films. Such a photoelectric conversion film is disposed above a semiconductor substrate including circuits. Japanese Patent Laid-Open No. 2014-067948 discloses a solid-state imaging element including an organic photoelectric conversion film used as a photoelectric conversion film.

Japanese Patent Laid-Open No. 2009-295799 discloses a method by which dangling bonds in a semiconductor substrate are reduced in a photoelectric converter including photoelectric conversion elements disposed in a silicon semiconductor substrate. In Japanese Patent Laid-Open No. 2009-295799, the dangling bonds are terminated in such a manner that hydrogen is diffused from a silicon oxide film by performing heat treatment after forming wiring patterns. Reducing the dangling bonds in the semiconductor substrate reduces noise in the photoelectric converter.

However, if the heat treatment described in Japanese Patent Laid-Open No. 2009-295799 is performed to reduce noise in the photoelectric converter having a photoelectric conversion film as described in Japanese Patent Laid-Open No. 2014-067948, the quality of the photoelectric conversion film might be changed. Even in a photoelectric conversion film made of any other material, high-temperature heat treatment might cause the change in quality of the photoelectric conversion film. Accordingly, the present invention provides a photoelectric converter having reduced noise without changing the characteristics of a photoelectric conversion film and a method for manufacturing the same.

SUMMARY OF THE INVENTION

In an example of a photoelectric converter method for manufacturing a photoelectric converter according to the present invention, a method for manufacturing a photoelectric converter includes a first step of preparing a semiconductor substrate including a metal oxide semiconductor (MOS) transistor, a second step of forming a plurality of interlayer insulating films above the semiconductor substrate, and a third step of forming a photoelectric conversion portion above the semiconductor substrate. The second step includes a step of forming a first film containing hydrogen. The third step includes a step of forming a first electrode, a step of forming a photoelectric conversion film, and a step of forming a second electrode. The method includes a step of performing heat treatment between the step of forming a first film and the step of forming a photoelectric conversion film.

In an example of a photoelectric converter according to the present invention, a photoelectric converter including a semiconductor substrate includes a plurality of interlayer insulating films disposed above the semiconductor substrate, a photoelectric conversion portion, and a readout circuit portion including a MOS transistor disposed above the semiconductor substrate. The photoelectric conversion portion includes a first electrode disposed above the semiconductor substrate, a photoelectric conversion film disposed above the first electrode, and a second electrode disposed above the photoelectric conversion film. The first electrode is electrically connected to the MOS transistor. The plurality of interlayer insulating films includes a first film containing hydrogen that is disposed between the first electrode and the semiconductor substrate.

Further features of the present invention will become apparent from the following description of exemplary embodiments with reference to the attached drawings.

DESCRIPTION OF THE EMBODIMENTS

First Embodiment

Figure 1:
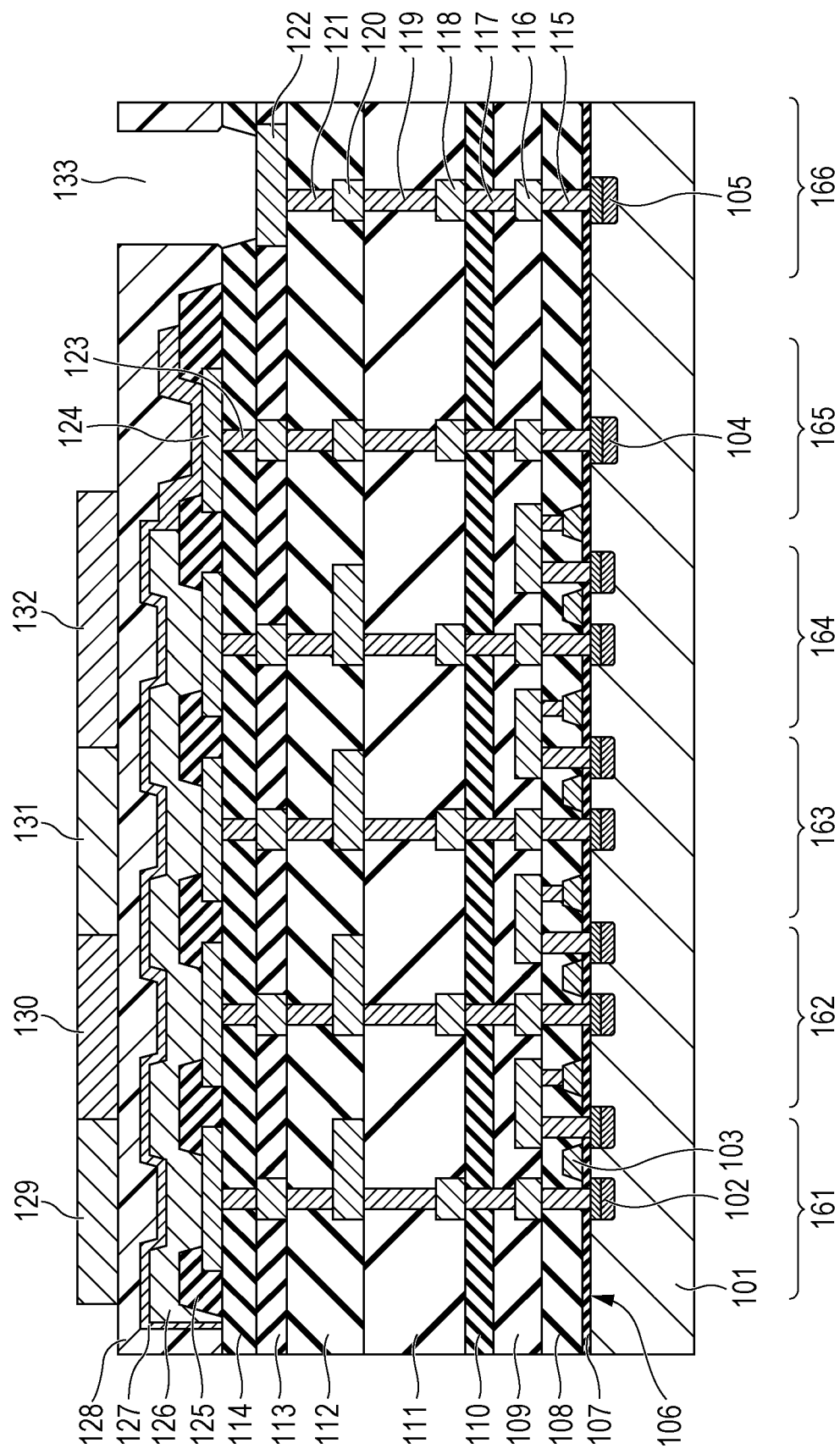
FIG. 1 is a cross-sectional schematic diagram of a photoelectric converter for explaining a first embodiment.

A first embodiment will be described by using FIG. 1. Members in respective layers in FIG. 1 are denoted by the same reference numerals as those for the layers. Note that a well-known or publicly known technique is applied to a portion not illustrated or not described in the present specification.

FIG. 1 is a cross-sectional schematic diagram of a photoelectric converter for explaining the present embodiment. The photoelectric converter has a plurality of pixels arranged in a two-dimensional array. FIG. 1 illustrates four pixels 161, 162, 163, and 164. Each of the pixels 161 to 164 includes at least one photoelectric conversion portion and a readout circuit for reading out signals generated in the photoelectric conversion portion. The pixel 164 of the pixels 161 to 164 is an optical black (OPB) pixel including a black color filter 132. Signals obtained in the OPB pixel are used as reference signals. The readout circuit includes, for example, a transfer transistor electrically connected to the photoelectric conversion portion, an amplification transistor including a gate electrode electrically connected to the photoelectric conversion portion, and a reset transistor for resetting the photoelectric conversion portion. The photoelectric converter includes a peripheral circuit portion 165, a pad portion 166, and other portions in addition to the pixels 161 to 164. The pad portion 166 is a portion for electrically connecting to an external device, and a pad made of an electric conductor is exposed to the outside from the pad portion 166. The peripheral circuit portion 165 is a portion for controlling operation of the pixels 161 to 164 and for processing read out signals. The peripheral circuit portion 165 includes processing circuits such as an amplification circuit, a horizontal scan circuit, and a vertical scan circuit. FIG. 1 illustrates, as the peripheral circuit portion 165, part of a circuit for supplying a voltage to an electrode of each pixel.

The structures in FIG. 1 will be described. A semiconductor substrate 101 is provided with elements such as MOS transistors included in the pixels 161 to 164, the peripheral circuit portion 165, and the pad portion 166. The pixels 161 to 164 are each provided with a source-drain 102 and a gate 103 that are the MOS transistors. The peripheral circuit portion 165 is provided with a semiconductor region 104, and the pad portion 166 is provided with a semiconductor region 105. The semiconductor substrate 101 has a surface 106. A direction perpendicular to the surface 106 and extending toward the inside of the substrate is referred to as a downward direction, and a direction opposite to the downward direction is referred to as an upward direction. A distance in the upward direction is also referred to as a height with respect to the surface 106. The source-drain 102 is also referred to as one of the source and the drain in some cases.

The semiconductor substrate 101 is provided with a gate insulating layer 107 on the surface 106 and further provided with a plurality of interlayer insulating layers 108, 109, 110, 111, 112, 113, and 114 and a plurality of wiring layers 116, 118, 120, and 122. To electrically connect the wiring layers 116, 118, 120, and 122 to one another, contact layers 115 and via layers 117, 119, 121, and 123 each have plugs formed of an electric conductor mainly made of tungsten used as a main component, and may have a barrier metal such as titanium. The contact layers 115 and the via layers 117, 119, 121, and 123 are connected to the wiring layers 116, 118, 120, and 122. First electrode layers 124, a separation layer 125, a photoelectric conversion layer 126, and a second electrode layer 127 are disposed above the interlayer insulating layers 108 to 114 and the wiring layers 116, 118, 120, and 122. A planarizing layer 128 and color filter layers are disposed above the second electrode layer 127. The wiring layers 116, 118, 120, and 122 each have a plurality of wiring patterns. The contact layers 115 each have a plurality of contact plugs, and the via layers 117, 119, 121, and 123 each have a plurality of via plugs. The first electrode layers 124 each have a plurality of first electrodes. The separation layer 125 has a plurality of separation portions. The color filter layer has color filters 129, 130, 131, and 132 that are, for example, blue, green, red, and black, respectively. The black color filter functions as a light shielding member. Patterns and the like included in the layers are also denoted by the same reference numerals as those of the layers in the following description.

The photoelectric conversion portion is disposed above the semiconductor substrate 101, the interlayer insulating layers 108 to 114, and the plurality of wiring layers 116, 118, 120, and 122. The photoelectric conversion portion includes the first electrode 124, the photoelectric conversion layer 126, and a second electrode 127. The photoelectric conversion layer 126 and the second electrode 127 extend over the pixels but may each be divided into sections in such a manner that the sections correspond to the respective pixels.

In such a photoelectric converter, the interlayer insulating layers 108 to 114 include a first layer 110 containing hydrogen disposed between the semiconductor substrate 101 and the first electrodes 124. Examples of the hydrogen-containing layer include a silicon oxide film, a silicon oxynitride film, and a silicon nitride film. The silicon oxide film includes tetraethyl orthosilicate (TEOS), boron phosphorus silicate glass (BPSG), un-doped silicate glass (USG), and other components. It can be said that the silicon oxynitride film contains silicon, oxygen, and nitrogen. Disposing the first layer 110 containing hydrogen near the semiconductor substrate 101 enables a dangling bond in the surface 106 of the semiconductor substrate 101 to be terminated by using hydrogen, thus enabling reduction in noise attributable to the dangling bond.

Further, the interlayer insulating layers 108 to 114 include a second layer 114 disposed between the first layer 110 and the first electrodes 124, the second layer 114 having a function of preventing hydrogen movement. A film having a function of preventing hydrogen movement is a compact film such as a silicon nitride film (a film containing silicon and nitrogen) or a silicon carbide film (a film containing silicon and carbon). In other words, the second layer 114 has higher density per unit volume than the first layer 110 or may have lower hydrogen transmittance than the first layer 110. Disposing the second layer 114 above the first layer 110 can prevent hydrogen diffusing from the first layer 110 from diffusing in a direction opposite from a direction to the semiconductor substrate 101. Accordingly, an amount of hydrogen diffusing toward the semiconductor substrate 101 is increased, and noise can be reduced more.

The structures will next be described. The semiconductor substrate 101 is a semiconductor substrate made of, for example, silicon. The gate 103 is made of, for example, polysilicon. The gate insulating layer 107 is a silicon oxide film, a silicon oxynitride film, or the like. An inorganic material, such as a silicon oxide film or a silicon nitride film, and an organic material such as SiLK may be used for the interlayer insulating layers 108 to 114. The wiring layers 116, 118, 120, and 122 are made of an electric conductor containing aluminum or copper used as a main component. Since one of the wiring layers 122 includes the pad of the pad portion 166 in the present embodiment, the contact layers 115 and the via layers 117, 119, 121, and 123 are made of an electric conductor containing aluminum used as a main component. Each first electrode 124 is also referred to as a lower electrode and is made of an electric conductor containing aluminum or copper used as a main component. The first electrode 124 is electrically connected to the corresponding source-drain 102 of the MOS transistor of the readout circuit through the wiring layers 116, 118, 120, and 122. The second electrode 127 is also referred to as an upper electrode and located closer to a light incidence surface than the first electrode 124. The second electrode 127 is desirably made of a transparent conductive material and, for example, made of an electric conductor containing indium tin oxide (ITO), indium zinc oxide (IZO), or polyimide used as a main component. The second electrode 127 is electrically connected to the wiring layers 122 through the electric conductors in the first electrode layers 124 and thus is electrically connected to elements in the peripheral circuit portion 165. The photoelectric conversion layer 126 is made of an inorganic or organic material through which photoelectric conversion can be performed. For example, in the case of an inorganic material, an amorphous silicon layer, an amorphous selenium layer, a quantum dot layer, a compound semiconductor layer, or the like may be selected for the photoelectric conversion layer 126. As a material of the photoelectric conversion layer 126, an organic material may be used. Examples of the organic material include dyes such as a metal complex dye and a cyanine dye. Other conductive materials such as acridine, coumarin, triphenylmethane, fulleren, 8-hydroxyquinoline aluminum, polyparaphenylene vinylene, polyfluorene, polyvinyl carbazole, polytiol, polypyrrole, and polythiophene may also be used. In another example of the photoelectric conversion layer 126, a quantum dot layer may be used. For example, the quantum dot layer is formed of a buffer material of AlGaAs or GaAs and a quantum dot of InAs or InGaAs. The quantum dot layer may also be a layer obtained by diffusing a photoelectric conversion material in a buffer material made of an organic material. For the separation layer 125, an insulator such as a silicon oxide film may be used. As a material of the planarizing layer 128, an inorganic or organic material may be used, and, for example, a silicon nitride film, a silicon carbide film, or an acrylic resin may be used.

A method for manufacturing a photoelectric converter in the present embodiment will next be described. Description of part of the photoelectric converter that can be formed in a typical semiconductor process will be omitted in the manufacturing method described below.

A semiconductor substrate is first prepared in which semiconductor elements such as MOS transistors (102, 103, and 107) are formed. A plurality of interlayer insulating layers 108 to 114, a plurality of wiring layers 116, 118, 120, and 122, contact layers 115, and a plurality of via layers 117, 119, and 121 are then formed above the semiconductor substrate.

Heat treatment (a heat treatment step) for diffusing hydrogen is performed. The heat treatment is performed at a temperature from 250° C. to 450° C. in a hydrogen atmosphere, a nitrogen atmosphere, or an inert gas atmosphere. In particular, the hydrogen atmosphere is preferable.

After a second layer 114 is formed, and after the heat treatment step is performed, via layers 123 are formed. After the via layers 123 are formed, first electrode layers 124, a separation layer 125, a photoelectric conversion layer 126, and a second electrode layer 127 are formed in this order. After, for example, a silicon oxide film is formed, openings for causing the first electrodes 124 to be partially exposed are formed in the separation layer 125. The photoelectric conversion layer 126 is formed in such a manner as to cover portions from which the first electrodes 124 are exposed. The second electrode layer 127 is formed in such a manner as to cover the photoelectric conversion layer 126 in pixels 161 to 164 and to be connected to one of the patterns of the first electrode layers 124 in a peripheral circuit portion 165.

Thereafter, a planarizing layer 128 is formed, and color filters 129 to 132 are formed. A planarizing layer (not illustrated) or microlenses (not illustrated) may be formed on the color filters 129 to 132. An opening 133 is formed in the planarizing layer 128, and a pad is formed in the opening 133. A photoelectric converter is completed.

A method for manufacturing the plurality of interlayer insulating layers 108 to 114 will be described in detail. Silicon oxide films are formed as films except the first layer 110 and the second layer 114 among the interlayer insulating layers 108 to 114. The silicon oxide films are formed by using, for example, a plasma chemical vapor deposition (CVD) method or a high-density plasma CVD (HDP-CVD) method. The first layer 110 is formed by using a plasma CVD method or a thermal CVD method in such a manner that hydrogen is added to a source gas. The temperature (deposition temperature) at the time of forming the first layer 110 is equal to or lower than 450° C., more preferably, equal to or lower than 400° C. A silicon nitride film is formed as the second layer 114 by using an inductive coupling (ICP) HDP-CVD method or the thermal CVD method. The source gas contains $SiH_4$ and $O_2$. In some cases, Ar is added as a carrier gas. Alternatively, tetraethoxysilane (TEOS, $Si(OC_2H_5)_4$) and $O_2$ may be used as the source gas. The temperature (deposition temperature) at the time of forming the second layer 114 is equal to or lower than 450° C., more preferably, equal to or lower than 400° C. In a case where the temperature at the time of forming the first layer 110 is T1, and where the temperature at the time of forming the second layer 114 is T2, T1≤T2 is desirable to have a higher density of the second layer 114 than that of the first layer 110. In addition, the pressure in a chamber of a CVD device at the time of forming the first layer 110 is lower than the pressure in a chamber of a CVD device at the time of forming the second layer 114. The temperatures at the time of forming the first layer 110 and the second layer 114 are desirably equal to or lower than the temperature in the heat treatment step. In a case where the temperature in the heat treatment step is T3, T1≤T3 and T2≤T3 hold true, that is, desirably T1≤T2<T3.

After the first layer 110 and the second layer 114 are formed under these conditions, the heat treatment step is performed. The heat treatment step is performed at least before a step of forming the photoelectric conversion layer 126. Such a process can prevent the characteristics of the photoelectric conversion layer 126 from being changed.

In the case described in the present embodiment, the heat treatment step is performed after the second layer 114 is formed and before the first electrode layers 124 are formed. However, the heat treatment step may be performed after the first electrode layers 124 are formed. To reduce damages to a semiconductor substrate in the course of manufacturing, the heat treatment is desirably performed as late as possible in the manufacturing process. In addition, performing the heat treatment step before forming the second electrode layer 127 can prevent a change in the resistance of the second electrode layer 127.

In the present embodiment, the photoelectric conversion layer 126 is enclosed by the planarizing layer 128 and the second layer 114 that are silicon nitride films. Such a structure can prevent water or ions from entering the photoelectric conversion layer 126.

Second Embodiment

Figure 2:
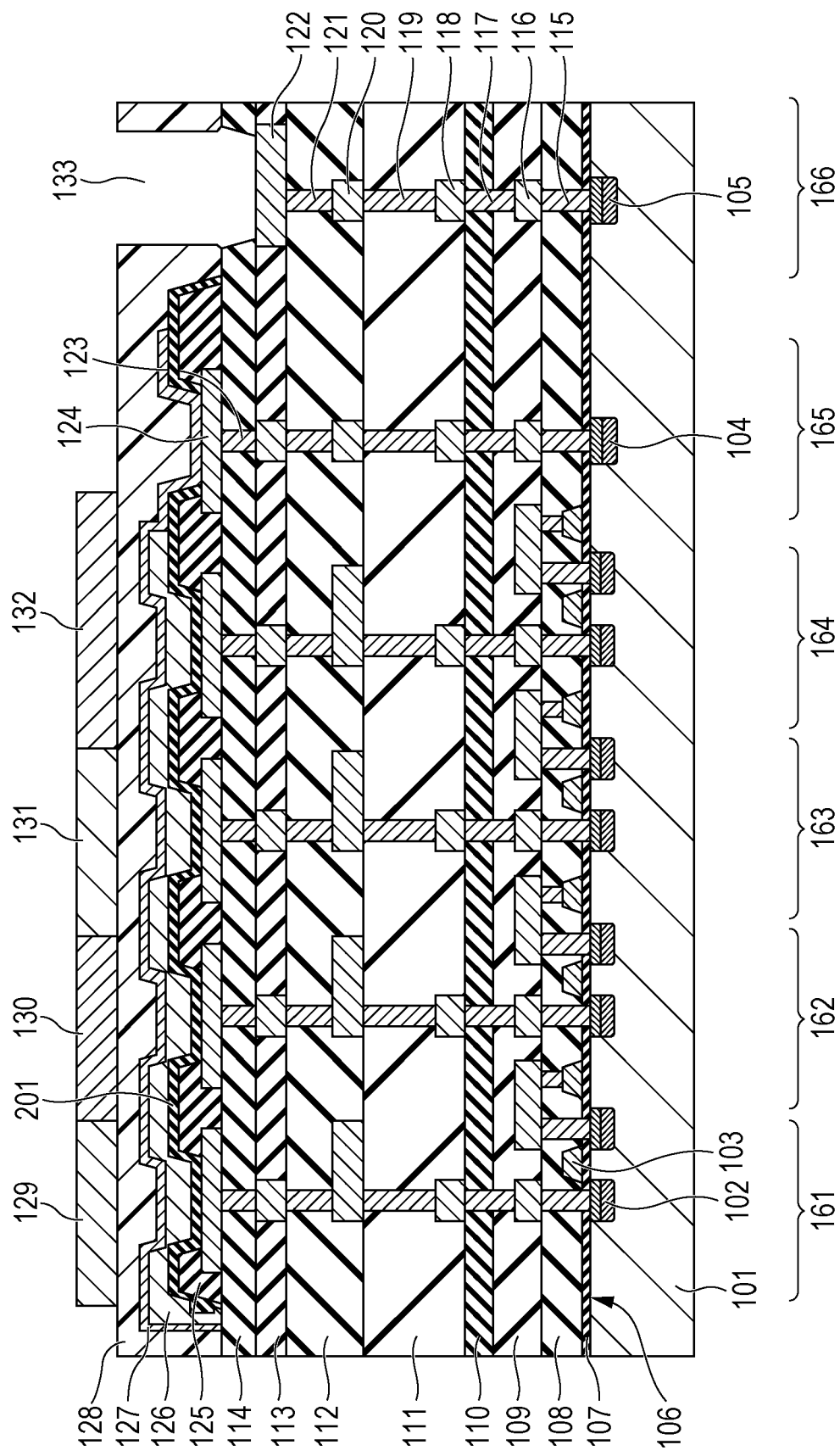
FIG. 2 is a cross-sectional schematic diagram of a photoelectric converter for explaining a second embodiment.

A second embodiment will be described by using FIG. 2. The second embodiment is different from the first embodiment in that an insulating layer 201 is disposed between each first electrode 124 and the photoelectric conversion layer 126. The same structures in the present embodiment as those in the first embodiment are denoted by the same reference numerals, and description thereof will be omitted.

In the present embodiment, a photoelectric conversion portion includes the first electrodes 124, the insulating layer 201, the photoelectric conversion layer 126, and the second electrode 127. The structure of the photoelectric conversion portion in the present embodiment is also referred to as a metal insulator semiconductor (MIS) structure. The insulating layer 201 covers the first electrodes 124 and is located above the separation portion 125. The insulating layer 201 may be disposed at least between each first electrode 124 and the photoelectric conversion layer 126 and may be disposed below the separation portion 125. Such a structure also enables noise reduction in the photoelectric converter like the first embodiment.

Third Embodiment

Figure 3:
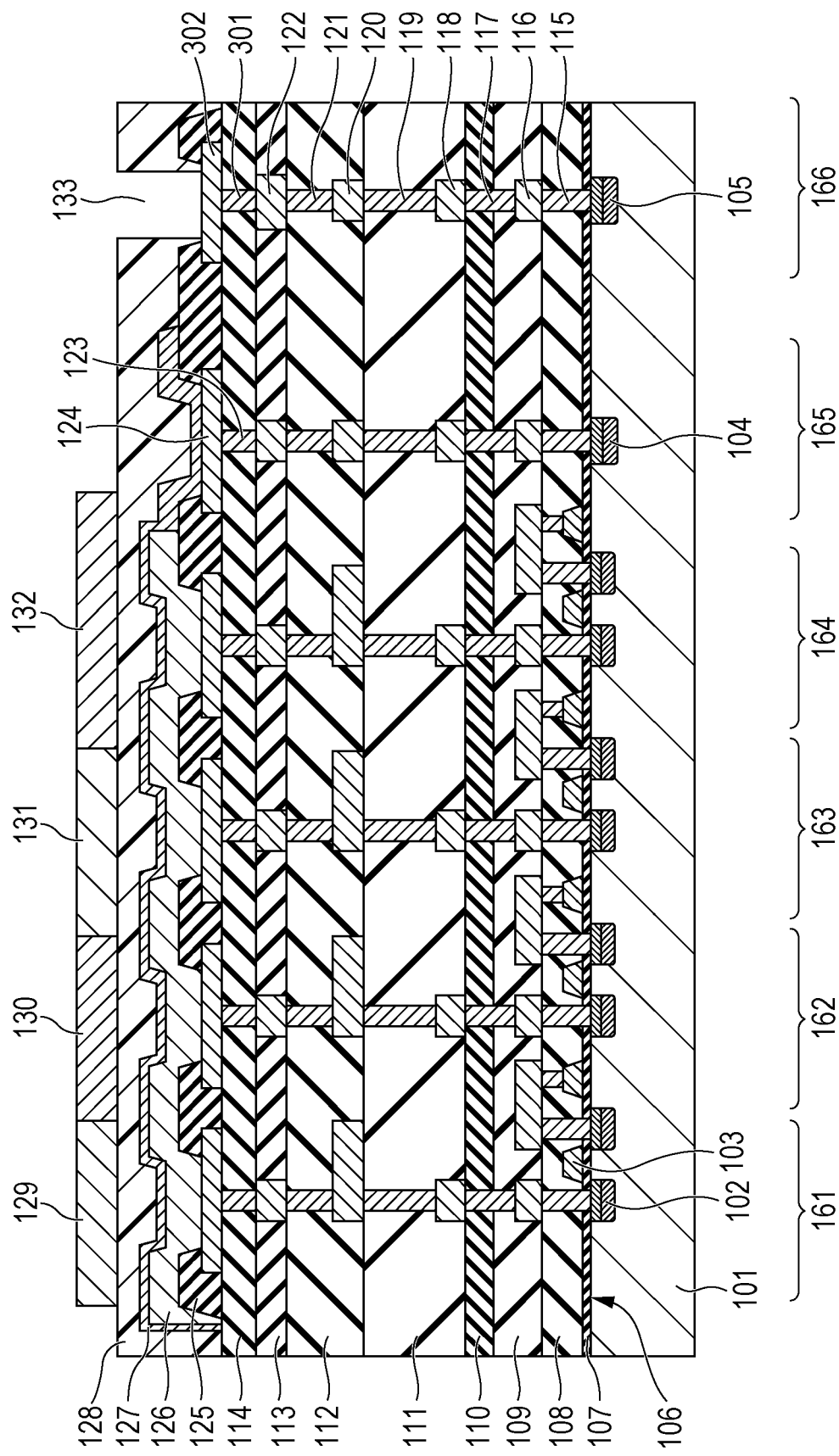
FIG. 3 is a cross-sectional schematic diagram of a photoelectric converter for explaining a third embodiment.

A third embodiment will be described by using FIG. 3. A difference of the third embodiment from the first embodiment lies in the structure of the pad portion 166. The same structures in the present embodiment as those in the first embodiment are denoted by the same reference numerals, and description thereof will be omitted.

The present embodiment is different in that not the wiring pattern in the corresponding wiring layer 122 but a pattern 302 in the corresponding first electrode layer 124 is used in a pad exposed due to the opening 133 in the pad portion 166. The pattern 302 is connected to the wiring pattern of the wiring layer 122 through a via plug 301 of the corresponding via layer 123. Such a structure also enables noise reduction in the photoelectric converter like the first embodiment.

Fourth Embodiment

Figure 4:
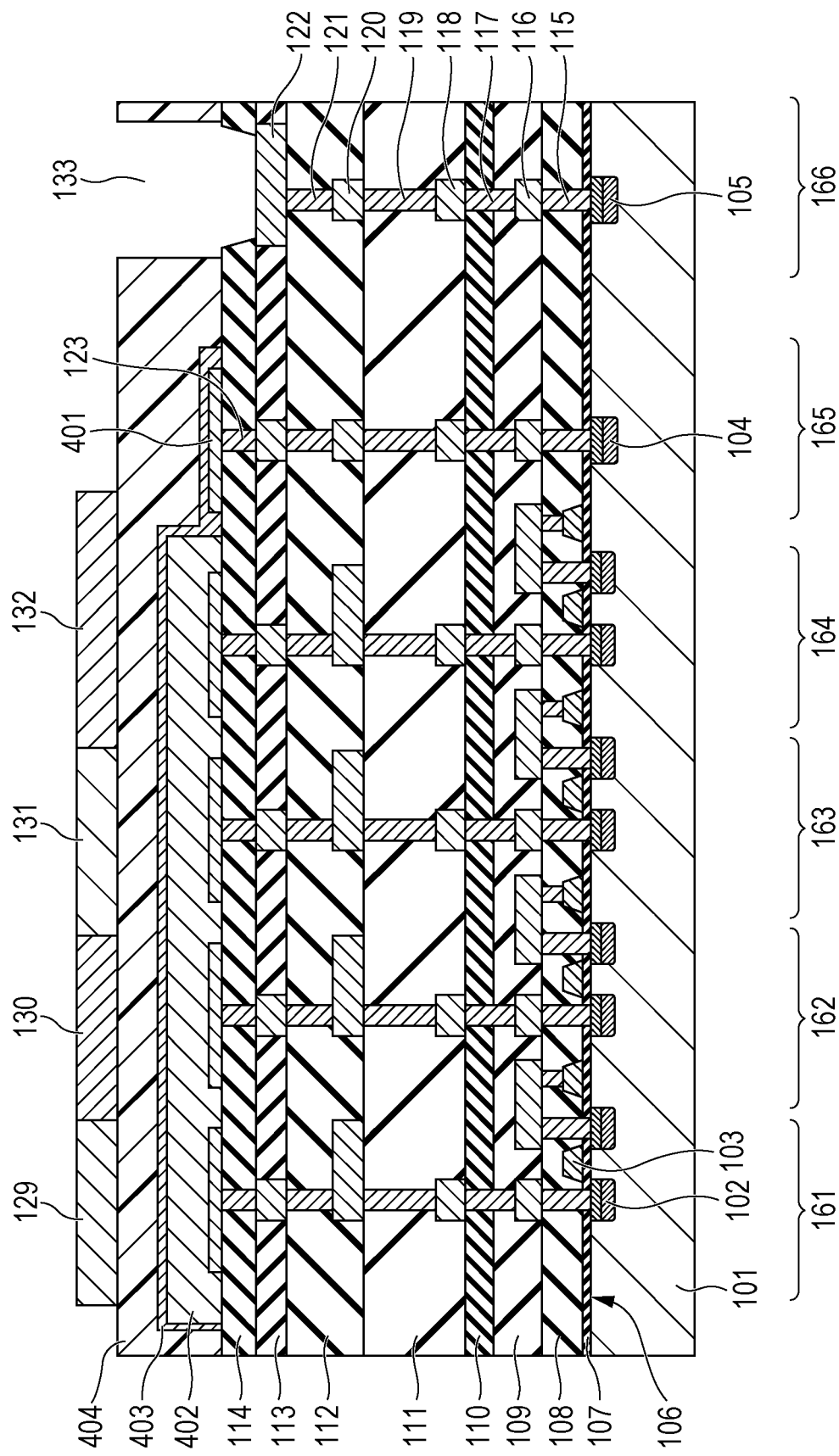
FIG. 4 is a cross-sectional schematic diagram of a photoelectric converter for explaining a fourth embodiment.

A fourth embodiment will be described by using FIG. 4. The fourth embodiment is different from the first embodiment in that the separation layer 125 is not provided. The same structures in the present embodiment as those in the first embodiment are denoted by the same reference numerals, and description thereof will be omitted.

Since the separation layer 125 is not provided in the present embodiment, first electrode layers 401 are made thinner than the first electrode layers 124 in the first embodiment (a short distance between the upper surface and the lower surface of each first electrode layer 401). Even though the separation layer 125 is not provided, such a structure enables reduction in leak among the first electrodes 401. Since the separation layer 125 is not provided, a photoelectric conversion layer 402 and a second electrode layer 403 have even upper surfaces, respectively. Since the photoelectric conversion layer 402 has the even upper surface, the second electrode layer 403 can be thin. In a case where the second electrode layer 403 is thin, an uneven upper surface of the photoelectric conversion layer 402 might cause disconnection. The structure as described above also enables a planarizing layer 404 to be thin.

Hereinafter, an example of application of the photoelectric converter according to any one of the aforementioned embodiments will be described by taking as an example an imaging system having the photoelectric converter incorporated therein. In the concept of the imaging system, the imaging system includes not only a device such as a camera mainly for shooting images but also a device having an auxiliary function of shooting images (such as a personal computer or a mobile terminal). The imaging system includes the photoelectric converter according to the present invention that is illustrated as the corresponding embodiment and a signal processor that processes signals output from the photoelectric converter. The signal processor may include, for example, an analog-to-digital (A/D) converter and a processor that processes digital data output from the A/D converter.

Each embodiment described above is an embodiment of the invention, and an embodiment of the invention is not limited to the embodiment described above. For example, a microlens layer may be disposed above the color filter layer in each embodiment. A functional layer such as a charge blocking layer may be disposed between at least one of the electrodes and the photoelectric conversion layer, the functional layer preventing charges from being injected from the electrode into the photoelectric conversion layer. The interlayer insulating layers, the insulating layers, the electrode layers, and other layers may each be a single layer or a multilayer and may be made of materials different from each other. The embodiments may be modified and combined appropriately and can be manufactured by using a publicly known semiconductor manufacturing technique.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A photoelectric conversion apparatus comprising:
    a photoelectric conversion area including a plurality of photoelectric conversion portions, wherein each of the plurality of the photoelectric conversion portions includes a first electrode arranged above a semiconductor substrate, a second electrode arranged above the first electrode, and a photoelectric conversion layer arranged between the first electrode and the second electrode; and
    a pad area including a pad configured to electrically connect to an external device, and arranged on an outer side of the photoelectric conversion area,
    wherein a first wiring layer is arranged between the first electrode and the semiconductor substrate in the photoelectric conversion area, and a first layer including a silicon nitride film or a silicon carbide film is arranged between the first wiring layer and the first electrode in the photoelectric conversion, and
    wherein the first layer overlaps the pad.

2. The photoelectric conversion apparatus according to claim 1,
    wherein the photoelectric conversion layer is shared by the plurality of the photoelectric conversion portions, and, in a first direction along a surface of the semiconductor substrate, a width of the first layer is wider than a width of the photoelectric conversion layer.

3. The photoelectric conversion apparatus according to claim 1,
    wherein a thickness of the photoelectric conversion layer is thicker than a thickness of the first electrode, and the thickness of the first electrode is thicker than a thickness of the second electrode.

4. The photoelectric conversion apparatus according to claim 1, further comprising a peripheral circuit area arranged between the photoelectric conversion area and the pad area, and including a pattern of a conductive material for connecting the second electrode,
    wherein the first layer is continuously arranged over the photoelectric conversion area, the peripheral circuit area, and the pad area.

5. The photoelectric conversion apparatus according to claim 4,
    wherein the second electrode is continuously arranged over the photoelectric conversion area and the peripheral circuit area, and
    wherein the second electrode directly connects to the pattern of the conductive material.

6. The photoelectric conversion apparatus according to claim 4, wherein, in a first direction along a surface of the semiconductor substrate, a width of the second electrode is wider than a width of the photoelectric conversion layer.

7. The photoelectric conversion apparatus according to claim 4,
wherein, in a first direction along a surface of the semiconductor substrate, a length between the second electrode and the pad is shorter than a length between the conductive material and the pad.

8. The photoelectric conversion apparatus according to claim 4, further comprising a first electrode layer including the first electrode, the pad, and the pattern of the conductive material.

9. The photoelectric conversion apparatus according to claim 1, further comprising a second layer arranged on the second electrode,
wherein the second layer is continuously arranged over the photoelectric conversion area and the pad area, and
wherein, in the pad area, the second layer has an opening exposing the pad.

10. The photoelectric conversion apparatus according to claim 9,
wherein the second layer is arranged over a side face of the photoelectric conversion layer.

11. The photoelectric conversion apparatus according to claim 1, further comprising a second layer arranged on the second electrode,
wherein the second layer is continuously arranged over the photoelectric conversion area and the pad area, and
wherein, in a first direction along a surface of the semiconductor substrate, a width of the first layer is wider than a width of the photoelectric conversion layer, and a width of the second layer is wider than a width of the photoelectric conversion layer.

12. The photoelectric conversion apparatus according to claim 11,
wherein the second layer is arranged over a side face of the photoelectric conversion layer, and
wherein the second electrode is arranged between the second layer and the photoelectric conversion layer, and is arranged over a side face of the photoelectric conversion layer.

13. The photoelectric conversion apparatus according to claim 1, further comprising a first electrode layer including the first electrode,
wherein the first electrode layer includes the pad.

14. The photoelectric conversion apparatus according to claim 1,
wherein the first wiring layer includes the pad.

15. The photoelectric conversion apparatus according to claim 1,
wherein the first layer is in contact with a under face of the pad.

16. The photoelectric conversion apparatus according to claim 1, further comprising an insulating layer arranged between the first electrode and the photoelectric conversion layer.

17. The photoelectric conversion apparatus according to claim 1,
wherein the second electrode includes at least one of indium tin oxide, indium zinc oxide, and polyimide.

18. The photoelectric conversion apparatus according to claim 1,
wherein the photoelectric conversion layer includes at least one of inorganic or organic material.

19. The photoelectric conversion apparatus according to claim 1, further comprising a color filter layer arranged above the second electrode and including a black color filter.

20. The photoelectric conversion apparatus according to claim 1, further comprising a third layer including a silicon oxide film, a silicon oxynitride film, or a silicon nitride film and arranged between the semiconductor substrate and the first layer.

21. An imaging system comprising:
the photoelectric conversion apparatus according to claim 1; and
a signal processing unit configured to process a signal from the photoelectric conversion apparatus.

22. A photoelectric conversion apparatus comprising,
a photoelectric conversion area including a plurality of photoelectric conversion portions, wherein each of the plurality of the photoelectric conversion portions includes a first electrode arranged above a semiconductor substrate, a second electrode arranged above the first electrode, and a photoelectric conversion layer arranged between the first electrode and the second electrode,
wherein a first wiring layer is arranged between the first electrode and the semiconductor substrate in the photoelectric conversion area, and a first layer including a silicon nitride film or a silicon carbide film is arranged between the first wiring layer and the first electrode in the photoelectric conversion,
wherein the photoelectric conversion layer is shared by the plurality of photoelectric conversion portions, and
wherein an outer edge of the photoelectric conversion film is arranged above the first layer.

23. The photoelectric conversion apparatus according to claim 22,
wherein, in a first direction along a surface of the semiconductor substrate, a width of the first layer is wider than a width of the photoelectric conversion layer.

24. The photoelectric conversion apparatus according to claim 22, further comprising a second layer arranged on the second electrode,
wherein, in a first direction along a surface of the semiconductor substrate, a width of the first layer is wider than a width of the photoelectric conversion layer, and a width of the second layer is wider than a width of the photoelectric conversion layer.

25. The photoelectric conversion apparatus according to claim 24,
wherein the second layer is arranged over a side face of the photoelectric conversion layer, and
wherein the second electrode is arranged between the second layer and the photoelectric conversion layer, and is arranged over a side face of the photoelectric conversion layer.

26. The photoelectric conversion apparatus according to claim 22, further comprising a third layer including a silicon oxide film, a silicon oxynitride film, or a silicon nitride film, and arranged between the semiconductor substrate and the first layer.

27. An imaging system comprising:
the photoelectric conversion apparatus according to claim 25; and
a signal processing unit configured to process a signal from the photoelectric conversion apparatus.

* * * * *